(12) United States Patent
Liao et al.

(10) Patent No.: US 11,005,007 B2
(45) Date of Patent: May 11, 2021

(54) LIGHT-EMITTING DEVICE AND MANUFACTURING METHOD THEREOF

(71) Applicant: EPISTAR CORPORATION, Hsinchu (TW)

(72) Inventors: Wen-Luh Liao, Hsinchu (TW); Chih-Chiang Lu, Hsinchu (TW); Shih-Chang Lee, Hsinchu (TW); Hung-Ta Cheng, Hsinchu (TW); Hsin-Chan Chung, Hsinchu (TW); Yi-Chieh Lin, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/568,546

(22) Filed: Sep. 12, 2019

(65) Prior Publication Data
US 2020/0006595 A1    Jan. 2, 2020

Related U.S. Application Data

(63) Continuation of application No. 15/686,331, filed on Aug. 25, 2017, now Pat. No. 10,453,995, which is a
(Continued)

(30) Foreign Application Priority Data

Oct. 22, 2013 (TW) ............................... 102138216

(51) Int. Cl.
*H01L 33/00* (2010.01)
*H01L 33/30* (2010.01)
(Continued)

(52) U.S. Cl.
CPC ........... *H01L 33/20* (2013.01); *H01L 33/0062* (2013.01); *H01L 33/0093* (2020.05); *H01L 2933/0091* (2013.01)

(58) Field of Classification Search
CPC ... H01L 33/0025; H01L 33/0062–0079; H01L 33/30; H01L 33/32; H01L 33/02; H01L 33/025; H01L 33/20; H01L 33/24; H01L 33/48; H01L 33/505; H01L 33/00; H01L 33/0045; H01L 33/005
See application file for complete search history.

(56) References Cited

U.S. PATENT DOCUMENTS 5,818,066 A * 10/1998 Duboz .................. B82Y 20/00
                                                      257/21
5,949,809 A *  9/1999 Ashida ................. H01S 5/2231
                                                      372/45.013
(Continued)

FOREIGN PATENT DOCUMENTS

TW          201232831 A    8/2012

*Primary Examiner* — Maliheh Malek
(74) *Attorney, Agent, or Firm* — Patterson + Sheridan, LLP

(57) ABSTRACT

The present disclosure provides a light-emitting device and manufacturing method thereof. The light-emitting device comprising: a light-emitting stack; and a semiconductor layer having a first surface connecting to the light-emitting stack, a second surface opposite to the first surface, and a void; wherein the void comprises a bottom part near the first surface and an opening on the second surface, and a dimension of the bottom part is larger than the dimension of the opening.

18 Claims, 5 Drawing Sheets

Related U.S. Application Data continuation of application No. 14/520,067, filed on Oct. 21, 2014, now Pat. No. 9,847,450.

(51) Int. Cl.
*H01L 33/20* (2010.01)
*H01L 33/42* (2010.01)

(56) References Cited

U.S. PATENT DOCUMENTS

| | | | | |
|---|---|---|---|---|
| 6,420,732 B1* | 7/2002 | Kung | H01L 33/145 | 257/79 |
| 6,784,462 B2* | 8/2004 | Schubert | H01L 33/405 | 257/98 |
| 7,012,279 B2* | 3/2006 | Wierer, Jr. | H01L 33/20 | 257/94 |
| 7,054,345 B2* | 5/2006 | Ryou | B82Y 20/00 | 372/45.01 |
| 7,123,638 B2* | 10/2006 | Leary | B82Y 20/00 | 372/43.01 |
| 7,157,297 B2* | 1/2007 | Kamikawa | H01S 5/2231 | 257/E21.09 |
| 7,187,007 B2* | 3/2007 | Kim | H01L 33/32 | 257/79 |
| 7,285,800 B2* | 10/2007 | Lai | H01L 33/22 | 257/79 |
| 7,442,964 B2* | 10/2008 | Wierer, Jr. | G02B 6/1225 | 257/98 |
| 7,462,869 B2* | 12/2008 | Ohashi | H01L 33/20 | 257/744 |
| 7,564,069 B2 | 7/2009 | Shei | | |
| 7,884,376 B2* | 2/2011 | Lu | H01L 33/387 | 257/81 |
| 8,022,425 B2* | 9/2011 | Yao | H01L 33/382 | 257/98 |
| 8,080,833 B2* | 12/2011 | Grandusky | H01L 21/02458 | 257/190 |
| 8,097,897 B2* | 1/2012 | Chuang | H01L 33/10 | 257/13 |
| 8,110,838 B2* | 2/2012 | Pokrovskiy | H01L 33/08 | 257/79 |
| 8,373,152 B2* | 2/2013 | Song | H01L 33/14 | 257/13 |
| 8,384,104 B2* | 2/2013 | Kim | H01L 33/02 | 257/98 |
| 8,405,113 B2* | 3/2013 | Kazama | H01L 33/20 | 257/86 |
| 8,617,969 B2* | 12/2013 | Sakurai | H01L 33/0075 | 216/41 |
| 9,153,944 B2* | 10/2015 | Lee | H01S 5/04256 | |
| 9,159,889 B2* | 10/2015 | Weidner | H01L 33/20 | |
| 9,224,917 B2* | 12/2015 | Seo | H01L 33/10 | |
| 9,306,115 B1* | 4/2016 | Lin | H01L 33/30 | |
| 9,318,663 B2* | 4/2016 | Tsai | H01L 33/20 | |
| 9,331,247 B2 | 5/2016 | Liao et al. | | |
| 9,806,228 B2* | 10/2017 | Jain | H01L 33/12 | |
| 9,831,384 B2 | 11/2017 | Chen et al. | | |
| 9,847,450 B2* | 12/2017 | Liao | H01L 33/20 | |
| 10,032,954 B2* | 7/2018 | Yu | H01L 33/46 | |
| 10,156,335 B1* | 12/2018 | Li | F21S 43/14 | |
| 10,312,407 B2* | 6/2019 | Yu | H01L 33/60 | |
| 2001/0012089 A1 | 8/2001 | Shiraishi | | |
| 2003/0006429 A1* | 1/2003 | Takahashi | H01S 5/18311 | 257/200 |
| 2003/0039295 A1* | 2/2003 | Wipiejewski | H01S 5/18325 | 372/96 |
| 2003/0134446 A1* | 7/2003 | Koike | H01L 21/0237 | 438/41 |
| 2003/0141506 A1* | 7/2003 | Sano | H01L 33/38 | 257/78 |
| 2003/0146444 A1* | 8/2003 | Onishi | H01L 21/02392 | 257/85 |
| 2004/0004226 A1* | 1/2004 | Eisert | H01L 33/08 | 257/95 |
| 2004/0041156 A1* | 3/2004 | Tsuda | H01L 33/20 | 257/79 |
| 2004/0056261 A1* | 3/2004 | Tsuda | H01L 33/32 | 257/80 |
| 2004/0081215 A1* | 4/2004 | Johnson | H01S 5/423 | 372/50.11 |
| 2004/0238811 A1* | 12/2004 | Nakamura | H01L 33/28 | 257/13 |
| 2005/0227379 A1* | 10/2005 | Donofrio | H01L 33/0095 | 438/4 |
| 2006/0131590 A1* | 6/2006 | Takakura | B82Y 20/00 | 257/79 |
| 2006/0223211 A1* | 10/2006 | Mishra | B82Y 10/00 | 438/41 |
| 2006/0255341 A1* | 11/2006 | Pinnington | B82Y 20/00 | 257/79 |
| 2006/0258027 A1* | 11/2006 | Ohmae | H01L 33/007 | 438/22 |
| 2007/0001181 A1* | 1/2007 | Chen | H01L 33/44 | 257/98 |
| 2007/0018187 A1* | 1/2007 | Lee | H01L 33/22 | 257/98 |
| 2007/0085093 A1* | 4/2007 | Ohmae | H01L 33/08 | 257/89 |
| 2007/0176191 A1 | 8/2007 | Im | | |
| 2007/0206130 A1* | 9/2007 | Wuu | H01L 33/10 | 349/88 |
| 2008/0048194 A1* | 2/2008 | Kudo | H01L 33/14 | 257/94 |
| 2008/0093612 A1* | 4/2008 | Konno | H01L 33/22 | 257/96 |
| 2008/0121906 A1* | 5/2008 | Yakushiji | H01L 33/0095 | 257/94 |
| 2008/0128716 A1* | 6/2008 | Tazima | H01L 33/20 | 257/88 |
| 2008/0131987 A1* | 6/2008 | Horino | H01L 33/08 | 438/43 |
| 2008/0135861 A1* | 6/2008 | Pokrovskiy | H01L 33/08 | 257/98 |
| 2008/0169479 A1* | 7/2008 | Xu | H01L 33/20 | 257/94 |
| 2008/0173887 A1* | 7/2008 | Baba | H01L 33/20 | 257/98 |
| 2009/0121246 A1* | 5/2009 | Denbaars | H01L 33/145 | 257/98 |
| 2009/0121250 A1* | 5/2009 | DenBaars | H01L 33/54 | 257/98 |
| 2009/0159910 A1* | 6/2009 | Lin | H01L 33/22 | 257/98 |
| 2009/0166666 A1* | 7/2009 | Yao | H01L 33/382 | 257/101 |
| 2009/0267098 A1* | 10/2009 | Choi | H01L 33/20 | 257/98 |
| 2009/0309514 A1* | 12/2009 | Kim | H01L 33/62 | 315/291 |
| 2009/0315054 A1* | 12/2009 | Kim | H01L 33/20 | 257/98 |
| 2010/0012962 A1* | 1/2010 | Hong | H01L 33/0079 | 257/98 |
| 2010/0012969 A1* | 1/2010 | Yoon | H01L 33/0079 | 257/99 |
| 2010/0025714 A1* | 2/2010 | Hsu | H01L 33/0079 | 257/98 |
| 2010/0026779 A1* | 2/2010 | Yonehara | B41J 2/45 | 347/238 |
| 2010/0032701 A1* | 2/2010 | Fudeta | H01L 33/46 | 257/98 |
| 2010/0102353 A1* | 4/2010 | Park | H01L 33/32 | 257/98 |
| 2010/0117070 A1* | 5/2010 | Adekore | H01L 21/0237 | 257/43 |
| 2010/0148197 A1* | 6/2010 | Bour | H01L 21/268 | 257/98 |

(56) References Cited

U.S. PATENT DOCUMENTS

| | | | |
|---|---|---|---|
| 2010/0224897 A1* | 9/2010 | Huang | H01L 33/20 257/98 |
| 2010/0224898 A1 | 9/2010 | Kazama | |
| 2010/0308355 A1* | 12/2010 | Hsieh | H01L 33/642 257/98 |
| 2011/0012089 A1* | 1/2011 | Khan | H01L 33/12 257/13 |
| 2011/0012155 A1* | 1/2011 | Huang | H01L 33/0095 257/98 |
| 2011/0039364 A1 | 2/2011 | Kawashima et al. | |
| 2011/0057223 A1* | 3/2011 | Hwang | H01L 33/405 257/98 |
| 2011/0057224 A1* | 3/2011 | Hwang | H01L 33/20 257/98 |
| 2011/0062412 A1* | 3/2011 | Song | H01L 33/14 257/13 |
| 2011/0073894 A1* | 3/2011 | Chu | H01L 33/22 257/98 |
| 2011/0095323 A1* | 4/2011 | Han | H01L 33/20 257/98 |
| 2011/0156000 A1* | 6/2011 | Cheng | H01L 33/0066 257/13 |
| 2011/0254031 A1* | 10/2011 | Yan | H01L 33/08 257/98 |
| 2011/0260211 A1* | 10/2011 | Cheng | H01L 33/007 257/103 |
| 2011/0266568 A1* | 11/2011 | Aldaz | H01L 33/387 257/98 |
| 2012/0007042 A1* | 1/2012 | Hsieh | H01L 33/0062 257/13 |
| 2012/0007118 A1* | 1/2012 | Choi | H01L 33/62 257/98 |
| 2012/0009768 A1* | 1/2012 | Tadatomo | C30B 25/18 438/479 |
| 2012/0018758 A1* | 1/2012 | Matioli | B82Y 20/00 257/98 |
| 2012/0018764 A1* | 1/2012 | Choi | H01L 33/40 257/99 |
| 2012/0025251 A1* | 2/2012 | Kazama | H01L 33/38 257/98 |
| 2012/0049179 A1* | 3/2012 | Kuo | H01L 33/10 257/43 |
| 2012/0061667 A1* | 3/2012 | Huang | H01L 27/153 257/43 |
| 2012/0083063 A1* | 4/2012 | Shinoda | H01L 21/0242 438/47 |
| 2012/0086032 A1* | 4/2012 | Huang | H01L 33/20 257/98 |
| 2012/0088318 A1* | 4/2012 | Chang | H01L 33/0079 438/26 |
| 2012/0126241 A1* | 5/2012 | Okuno | H01L 33/22 257/76 |
| 2012/0161102 A1* | 6/2012 | Won | H01L 33/06 257/13 |
| 2012/0193664 A1* | 8/2012 | Lin | H01L 33/10 257/98 |
| 2012/0196391 A1* | 8/2012 | Tu | B82Y 40/00 438/22 |
| 2012/0199810 A1* | 8/2012 | Lee | H01L 21/0254 257/13 |
| 2012/0231568 A1* | 9/2012 | Shibata | H01L 21/0242 438/47 |
| 2012/0231608 A1* | 9/2012 | Shibata | H01L 21/0242 438/458 |
| 2012/0235115 A1* | 9/2012 | Kang | H01L 21/0237 257/13 |
| 2012/0261702 A1* | 10/2012 | Su | H01L 33/007 257/98 |
| 2012/0276673 A1* | 11/2012 | Wei | H01L 21/0237 438/42 |
| 2012/0299014 A1* | 11/2012 | Hikosaka | H01L 33/12 257/77 |
| 2013/0056748 A1* | 3/2013 | Matsui | H01L 33/60 257/76 |
| 2013/0069033 A1* | 3/2013 | Kushibe | H01L 33/06 257/13 |
| 2013/0193448 A1* | 8/2013 | Chou | C30B 25/18 257/77 |
| 2013/0214246 A1* | 8/2013 | Niou | H01L 21/0242 257/13 |
| 2013/0228744 A1* | 9/2013 | Kazama | H01L 33/382 257/13 |
| 2013/0277697 A1* | 10/2013 | Lai | H01L 33/60 257/98 |
| 2013/0313597 A1* | 11/2013 | Dai | H01L 33/20 257/98 |
| 2013/0320301 A1* | 12/2013 | Seo | H01L 33/10 257/13 |
| 2013/0341661 A1* | 12/2013 | Higashino | H01L 33/60 257/98 |
| 2014/0070165 A1* | 3/2014 | Park | H01L 21/02458 257/13 |
| 2014/0097457 A1* | 4/2014 | Wu | H01L 33/10 257/98 |
| 2014/0124734 A1* | 5/2014 | Lin | H01L 21/0237 257/13 |
| 2014/0131690 A1* | 5/2014 | Kondo | H01L 51/5203 257/40 |
| 2014/0131732 A1* | 5/2014 | Fu | H01L 33/12 257/76 |
| 2014/0134773 A1* | 5/2014 | Jain | H01L 33/32 438/44 |
| 2014/0193932 A1* | 7/2014 | Lee | H01L 27/15 438/29 |
| 2014/0203293 A1* | 7/2014 | Hwang | H01L 33/007 257/76 |
| 2014/0209949 A1* | 7/2014 | Chuang | H01L 33/46 257/98 |
| 2014/0231840 A1* | 8/2014 | Fudeta | H01L 33/12 257/97 |
| 2014/0327036 A1* | 11/2014 | Chiu | H01L 33/007 257/103 |
| 2014/0353580 A1* | 12/2014 | Kang | H01L 33/007 257/13 |
| 2014/0361246 A1* | 12/2014 | Moon | H01L 33/06 257/13 |
| 2014/0367722 A1* | 12/2014 | Im | H01L 33/32 257/98 |
| 2015/0048380 A1* | 2/2015 | Koike | H01L 33/22 257/76 |
| 2015/0097209 A1* | 4/2015 | Yang | H01L 33/20 257/103 |
| 2015/0102285 A1* | 4/2015 | Liao | H01L 33/06 257/13 |
| 2015/0111322 A1* | 4/2015 | Liu | H01L 33/382 438/22 |
| 2015/0144875 A1* | 5/2015 | Zhong | H01L 33/32 257/13 |
| 2015/0144980 A1* | 5/2015 | Tsai | H01L 33/30 257/98 |
| 2015/0144984 A1* | 5/2015 | Chen | H01L 33/08 257/99 |
| 2015/0155330 A1* | 6/2015 | Oh | H01L 33/62 257/89 |
| 2015/0179857 A1* | 6/2015 | Lin | H01L 31/0687 136/255 |
| 2015/0200331 A1* | 7/2015 | Chao | H01L 33/0079 438/26 |
| 2015/0207034 A1* | 7/2015 | Sakong | H01L 33/22 257/13 |
| 2015/0214428 A1* | 7/2015 | Fujimori | H01L 33/20 257/98 |
| 2015/0236204 A1* | 8/2015 | Wang | H01L 33/38 257/99 |
| 2015/0263221 A1* | 9/2015 | Adivarahan | H01L 33/22 257/76 |
| 2015/0270432 A1* | 9/2015 | Wu | H01L 33/0095 438/33 |

(56) References Cited

U.S. PATENT DOCUMENTS

| | | | |
|---|---|---|---|
| 2015/0325621 A1* | 11/2015 | Kim | H01L 33/005 |
| | | | 257/93 |
| 2015/0325741 A1* | 11/2015 | Komada | H01L 33/32 |
| | | | 257/76 |
| 2016/0197235 A1* | 7/2016 | Sung | H01L 33/32 |
| | | | 257/76 |
| 2016/0240728 A1* | 8/2016 | Kalliakos | H01L 33/38 |
| 2016/0240731 A1* | 8/2016 | Peng | H01L 33/10 |
| 2016/0247885 A1* | 8/2016 | Shatalov | H01L 21/02505 |
| 2016/0284939 A1* | 9/2016 | Lin | H01L 33/387 |
| 2016/0336482 A1* | 11/2016 | Lu | H01L 25/0756 |
| 2017/0005227 A1* | 1/2017 | Peng | H01L 33/10 |
| 2017/0040491 A1* | 2/2017 | Chao | H01L 33/12 |
| 2017/0069791 A1* | 3/2017 | Yang | H01L 33/22 |
| 2017/0194532 A1* | 7/2017 | Lin | H01L 33/387 |
| 2017/0236978 A1* | 8/2017 | Tsai | H01L 33/42 |
| | | | 438/29 |
| 2018/0033918 A1* | 2/2018 | Lin | H01L 33/387 |
| 2018/0062033 A1* | 3/2018 | Chen | H01L 33/405 |
| 2018/0337304 A1* | 11/2018 | Fu | H01L 33/20 |
| 2019/0081213 A1* | 3/2019 | Chang | H01L 33/30 |
| 2019/0172977 A1* | 6/2019 | Tsai | H01L 33/405 |

\* cited by examiner

LIGHT-EMITTING DEVICE AND MANUFACTURING METHOD THEREOF

CROSS REFERENCE TO RELATED APPLICATIONS

This application is a continuation application of U.S. patent application Ser. No. 15/686,331, filed Aug. 25, 2017, which is a continuation application of U.S. patent application Ser. No. 14/520,067, filed on Oct. 21, 2014, which claims the right of priority based on TW application Ser. No. 102138216 filed on Oct. 22, 2013; the contents of which are incorporated herein by reference in its entirety.

FIELD OF DISCLOSURE

The present disclosure relates to a light-emitting device and manufacturing method thereof, in particular to a light-emitting device having voids and manufacturing method thereof.

BACKGROUND OF THE DISCLOSURE

A light-emitting diode (LED) is suitable for diverse lighting and display application because it has good opto-electrical characteristics of low power consumption, low heat generation, long life, shock tolerance, compact, and swift response. Because the luminous efficiency of an LED is the product of its internal quantum efficiency and light extraction efficiency, the improvement of the light extraction efficiency is one way in addition to the internal quantum efficiency to raise the luminous intensity of LED.

SUMMARY OF THE DISCLOSURE

The present disclosure provides a light-emitting device and manufacturing method thereof. The light-emitting device comprises: a light-emitting stack; and a semiconductor layer having a first surface connecting to the light-emitting stack, a second surface opposite to the first surface, and a void; wherein the void comprises a bottom part near the first surface and an opening on the second surface, and a dimension of the bottom part is larger than the dimension of the opening.

The present disclosure also provides a light-emitting device, which comprises a substrate; a light-emitting layer on the substrate and having a first width; an electrode on the light-emitting layer; a layer between the substrate and the light-emitting layer and having a second width larger than the first width; and a plurality of voids formed in the layer; wherein in a cross-sectional view, the electrode and the plurality of voids are not overlapped in a vertical direction.

The present disclosure also provides a light-emitting device, which comprises a substrate; a light-emitting layer having a first width; a semiconductor layer between the substrate and the light-emitting stack and having a second width larger than the first width; a plurality of voids spaced apart from each other and between the substrate and the light-emitting layer; and a bonding layer between the semiconductor layer and the substrate.

The present disclosure also provides a light-emitting device, which comprises a substrate; a light-emitting layer on the substrate and having a first width; an electrode on the light-emitting layer; a layer between the substrate and the light-emitting layer and having a second width larger than the first width; and a plurality of voids formed in the layer, each having a bottom part and an opening; wherein in a cross-sectional view, a dimension of the bottom part is larger than the dimension of the opening and the electrode and the plurality of voids are not overlapped in a vertical direction.

The method for forming the light-emitting device comprises: providing a substrate; forming a light-emitting stack on the substrate; forming a semiconductor layer on the light-emitting stack, the semiconductor layer having a first surface connecting to the light-emitting stack, and a second surface opposite to the first surface, and forming a void in the semiconductor layer; wherein the void comprises a bottom part near the first surface and an opening on the second surface, and a dimension of the bottom part is larger than the dimension of the opening.

DETAILED DESCRIPTION OF THE DISCLOSURE

Figure 1A:
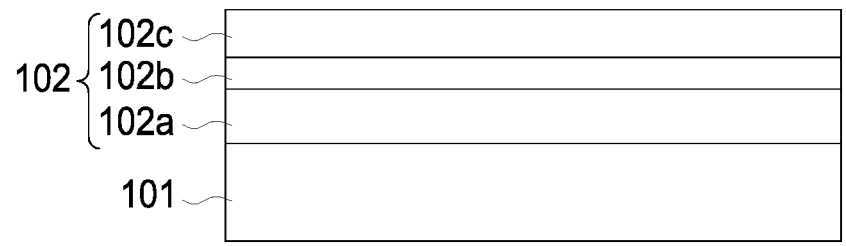
FIGS. 1(a) to 1(g) show a light-emitting device and manufacturing method thereof in accordance with a first embodiment of the present disclosure.

FIG. 1 shows a light-emitting device and manufacturing method thereof in accordance with a first embodiment of the present disclosure. As shown in FIG. 1(a), the method for forming the light-emitting device comprises providing a substrate 101, and forming a light-emitting stack 102 on the substrate 101. The light-emitting stack 102 comprises a semiconductor stack comprising a first conductivity type semiconductor layer 102a, a light-emitting layer 102b on the first conductivity type semiconductor layer 102a, and a second conductivity type semiconductor layer 102c on the light-emitting layer 102b. The first conductivity type semiconductor layer 102a and the second conductivity type semiconductor layer 102c are of different conductivity types. For example, the first conductivity type semiconductor layer 102a is an n-type semiconductor layer, and the second conductivity type semiconductor layer 102c is a p-type semiconductor layer. The first conductivity type semiconductor layer 102a, the light-emitting layer 102b, and the second conductivity type semiconductor layer 102c comprise III-V group material, such as AGaInP series materials.

Figure 1B:
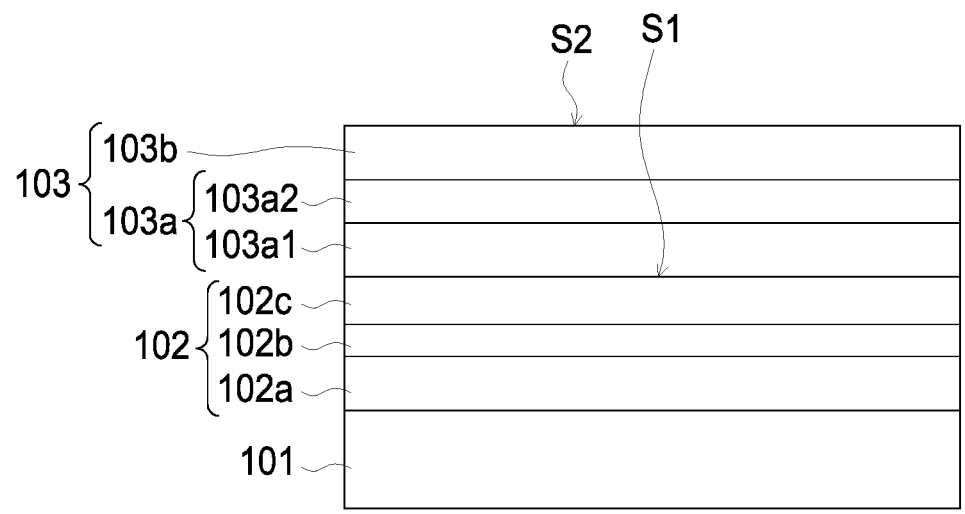

Next, as shown in FIG. 1(b), the method further comprises forming a semiconductor layer 103 on the light-emitting stack 102. The semiconductor layer 103 comprises material comprising aluminum, for example, aluminum arsenide (AlAs) and/or aluminum gallium arsenide (AlGaAs). A thickness of the semiconductor layer 103 is about from 1 μm to 10 μm. The semiconductor layer 103 comprises two opposite surfaces, wherein a first surface S1 is connected to the light-emitting stack 102, and a second surface S2 is opposite to the first surface S1. In the present embodiment, the semiconductor layer 103 comprises a first semiconductor layer 103a on the light-emitting stack 102, and a second semiconductor layer 103b on the first semiconductor layer 103a, wherein the aluminum content in the first semiconductor layer 103a is greater than the aluminum content in the second semiconductor layer 103b. For example, the first semiconductor layer 103a comprises aluminum arsenide (AlAs) and/or aluminum gallium arsenide ($Al_xGa_{1-x}As$), wherein $0.5 \leq x < 1$ in one embodiment, and a thickness is about 3 μm; the second semiconductor layer 103b does not contain aluminum. For example, the second semiconductor layer 103b comprises gallium phosphide (GaP) with a thickness of about 50 nm. Furthermore, in the present embodiment, the first semiconductor layer 103a is a two-layer structure. For example, the first semiconductor layer 103a comprises a first aluminum-contained layer 103a1 and a second aluminum-contained layer 103a2, and the aluminum contents are different in these two layers. In the present embodiment, the aluminum content in the first aluminum-contained layer 103a1 is greater than that of the second aluminum-contained layer 103a2. For example, the first aluminum-contained layer 103a1 comprises aluminum arsenide (AlAs), and the second aluminum-contained layer 103a2 comprises aluminum gallium arsenide ($Al_yGa_{1-y}As$), wherein $0.5 \leq y < 1$. Each of the first aluminum-contained layer 103a1 and the second aluminum-contained layer 103a2 has a thickness of about 1.5 μm.

Figure 1C:
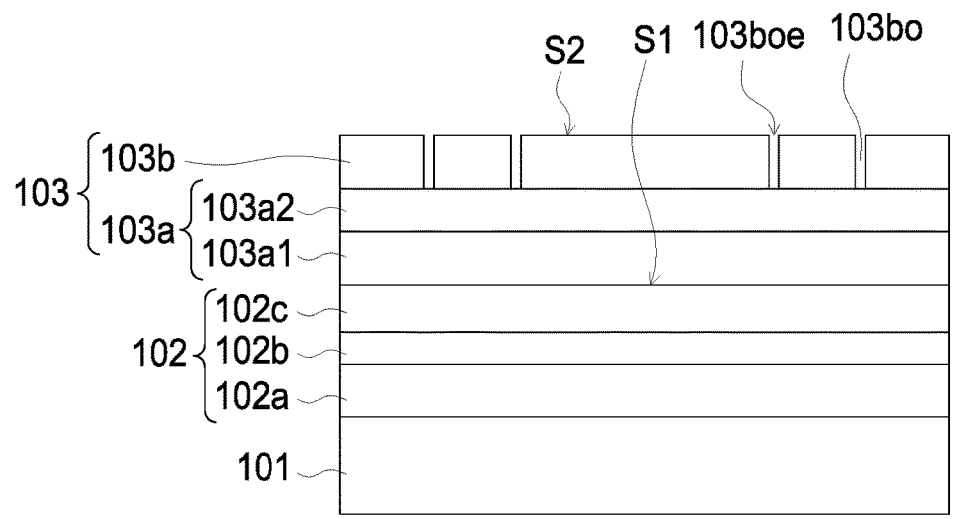
Figure 1D:
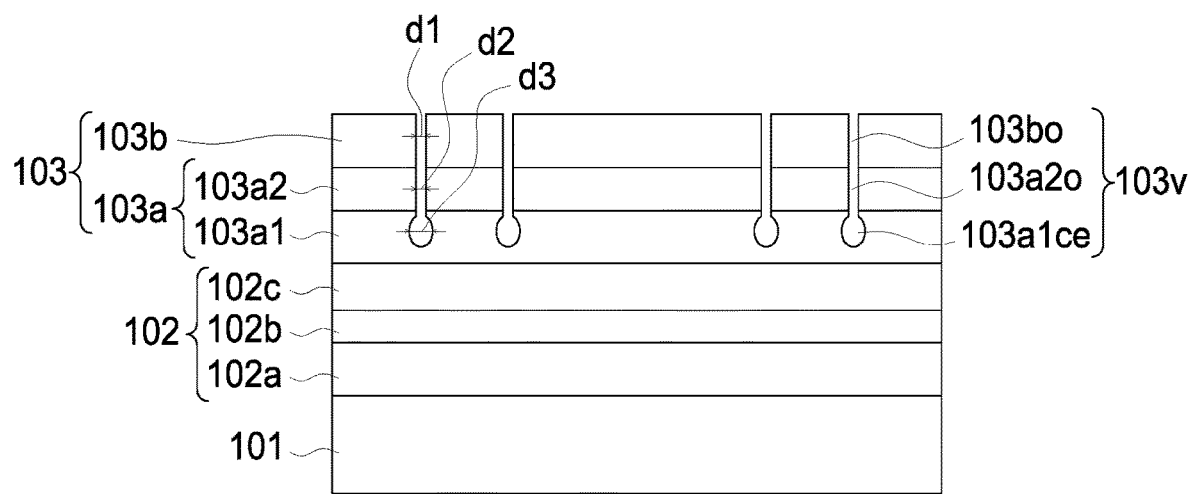

Next, a void formation step is performed. As shown in FIG. 1(c), the second semiconductor layer 103b is etched to form a hole for opening 103bo by lithography and etching processes. The hole for opening 103bo provides an opening 103boe on the second surface S2 and functions as an opening of the void. And then, as shown in FIG. 1(d), the first semiconductor layer 103a is etched by a wet etching process. In the present embodiment, an acid solution is used for the wet etching process. For example, citric acid or hydrofluoric acid (HF) is used. The acid solution etches and penetrates the second aluminum-contained layer 103a2 to form a penetrating part 103a2o. This penetrating part 103a2o functions as a middle part of the void 103v. The acid solution etches continuously the first aluminum-contained layer 103a1 to form a bottom hole 103a1ce which functions as a bottom part of the void 103v.

As mentioned above, it is noted that since the aluminum content in the first aluminum-contained layer 103a1 is different from that in the second aluminum-contained layer 103a2, the etching rates of the acid solution to these two layers are different. The higher aluminum content results in a higher etching rate. Therefore, a hole diameter d2 of the penetrating part 103a2o of the second aluminum-contained layer 103a2 which has a lower aluminum content is smaller than a hole diameter d3 of the bottom hole 103a1ce of the first aluminum-contained layer 103a1 which has a higher aluminum content. In addition, because the penetrating part 103a2o is formed by the etching of the acid solution which infiltrates into the second aluminum-contained layer 103a2 through the hole for opening 103bo of the above second semiconductor layer 103b, the hole diameter d2 of the penetrating part 103a2o is substantially equal to or slightly larger than the hole diameter d1 of the hole for opening 103bo of the second semiconductor layer 103b. In the present embodiment, both the hole diameter d1 of the hole for opening 103bo and the hole diameter d2 of the penetrating part 103a2o are about in the range of 0.1 μm≤d1 (or d2)≤20 μm. The hole diameter d3 of the bottom hole 103a1ce is about in the range of 1.2*d1≤d3≤10*d1. Thus, after the void formation step, the void 103v is formed in the semiconductor layer 103. The void 103v comprises a bottom part near the first surface S1, such as the bottom hole 103a1ce, and an opening located on the second surface S2, such as the opening 103boe, wherein the bottom part of the void 103v has a dimension (d3) larger than the dimension (d1) of the opening.

Based on the teaching of the above embodiment, the person of the ordinary skill of the art should understand that the cross-sectional shape of the void may be adjusted by controlling the aluminum content along the direction which the semiconductor layer 103 is formed. For example, by making the aluminum content in the first aluminum-contained layer 103a1 greater than that of the second aluminum-contained layer 103a2 in the above embodiment, the void can be formed by etching to have the bottom part with a larger dimension than that of the opening. Therefore, in a modified embodiment, all elements are the same as the above embodiment except that the second aluminum-contained layer 103a2 is not formed. In another modified embodiment, the second semiconductor layer 103b is not formed, and the first semiconductor layer 103a (to be more specific, the second aluminum-contained layer 103a2 thereof) is coated with a photo-resistor which is then exposed and developed to have a circular opening, and the second aluminum-contained layer 103a2 and the first aluminum-contained layer 103a1 are etched by an acid solution to form voids. These voids can effectively improve the light extraction efficiency of the light-emitting diode, and enhance luminous intensity of the light-emitting diode.

Figure 1E:
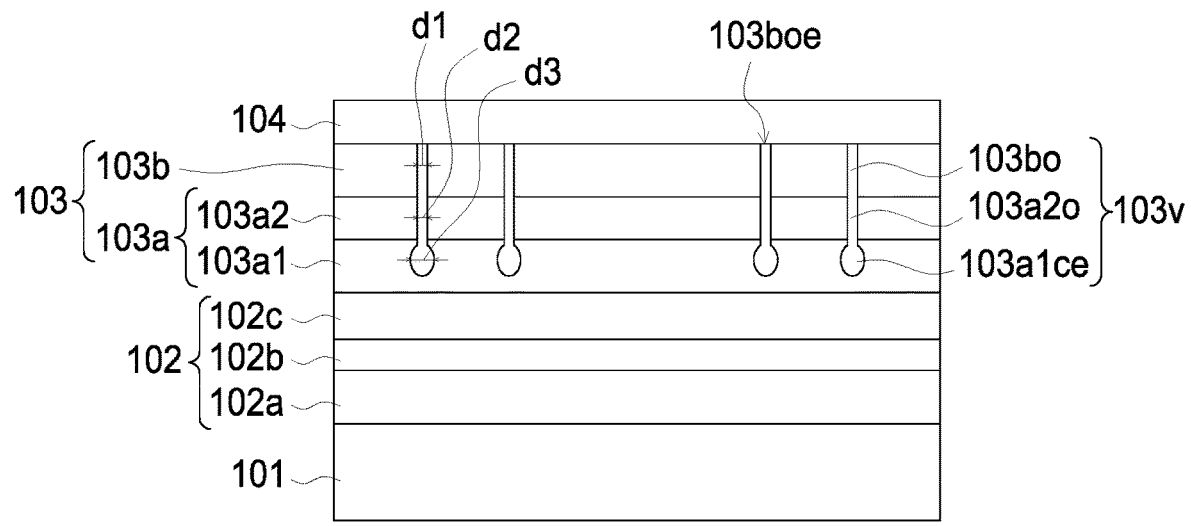

Next, as shown in FIG. 1(e), a transparent conductive layer 104 is formed on the second surface S2 to seal the opening 103boe. In the present embodiment, the transparent conductive layer 104 comprises a transparent conductive oxide layer, such as one material selected from indium tin oxide (ITO), aluminum zinc oxide (AZO), cadmium tin oxide, antimony tin oxide, zinc oxide (ZnO), and zinc tin oxide.

Figure 1F:
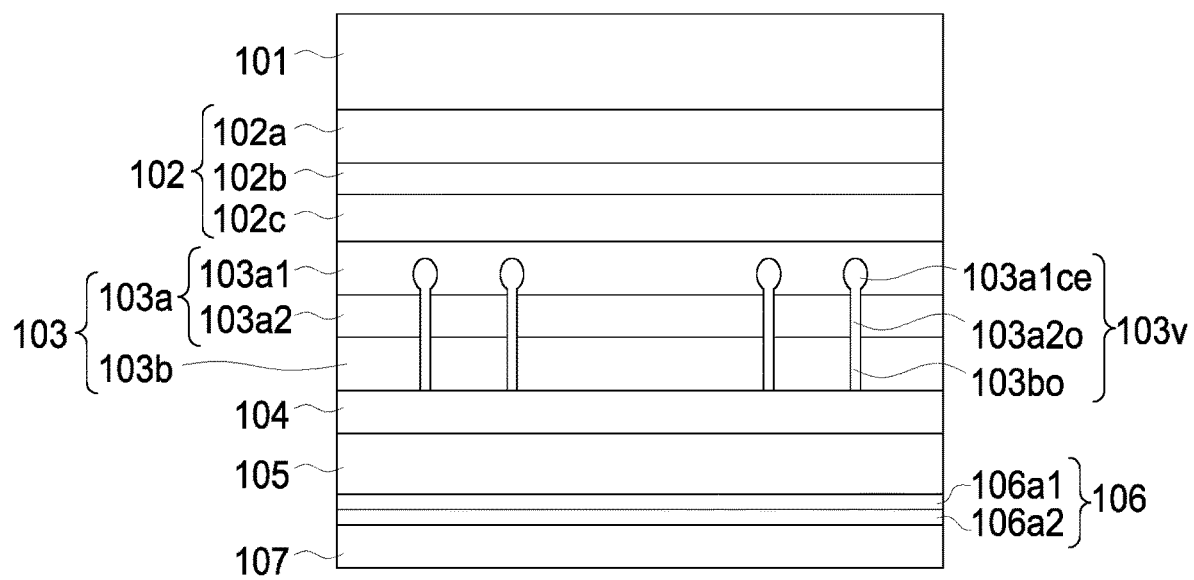
Figure 1G:
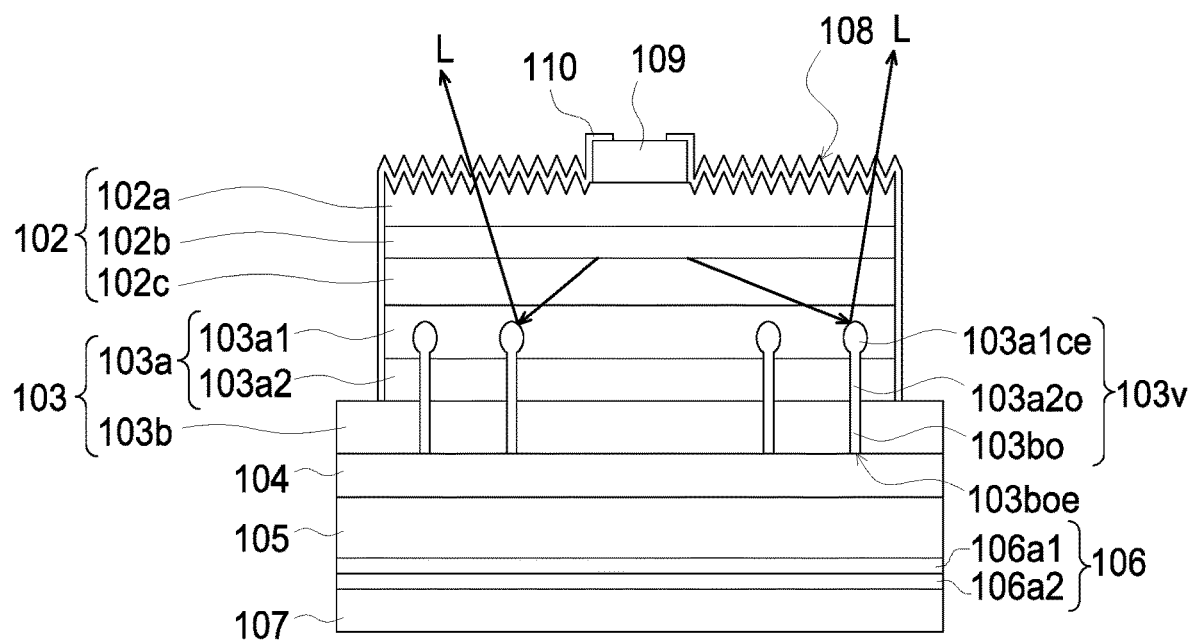

Next, as shown in FIG. 1(f), wherein FIG. 1(e) is placed upside down, a metal layer 105 is formed on and connects to the transparent conductive layer 104. A first bonding layer 106a1 is formed to connect to the metal layer 105. The metal layer 105 comprises a metal material having a high reflectivity, such as gold (Au), silver (Ag), or aluminum (Al), to function as a reflector. Then, a permanent substrate 107 is provided. The permanent substrate 107 comprises an electrically conductive material, such as silicon (Si) or silicon carbide (SiC). A second bonding layer 106a2 is formed on the permanent substrate 107. The first bonding layer 106a1 and the second bonding layer 106a2 comprise gold (Au), indium (In) or an alloy formed by both. The first bonding layer 106a1 and the second bonding layer 106a2 are bonded together to form the bonding structure 106. As shown in FIG. 1(g), the substrate 101 is removed, and the electrode 109 is formed on the first conductivity type semiconductor layer 102a to form an ohmic contact. In addition, a roughening process is optionally performed to the first conductivity type semiconductor layer 102a to form a roughened surface on the first conductivity type semiconductor layer 102a to increase the light extraction. Finally, a passivation layer 108 is formed on the first conductivity type semiconductor layer 102a to protect the light-emitting device. Because the semiconductor layer 103 comprises aluminum which tends to react with the moisture in the air, the passivation layer 108 is also formed to cover the sidewalls of the semiconductor layer 103 so as to improve the reliability of the light-emitting device. The specific embodiment is shown in FIG. 1(g). A lithography process and an etching process are performed to the light-emitting device to remove the sidewalls of the light-emitting stack 102 and part of the semiconductor layer 103 so that the passivation layer 108 also covers the sidewalls of the semiconductor layer 103 when it is formed. Because the second semiconductor layer 103b in the present embodiment does not contain aluminum, the aforementioned etching process may be performed until the first semiconductor layer 103a is etched and the second semiconductor layer 103b which does not comprises aluminum is exposed. As shown in FIG. 1(g), when light L emitted by the light-emitting stack 102 reaches the void 103v, the reflecting effect and scattering effect occur, so the light extraction efficiency of the light-emitting diode is improved, and the luminous intensity and the luminous uniformity at the light extraction surface of the light-emitting diode is raised.

Figure 2:
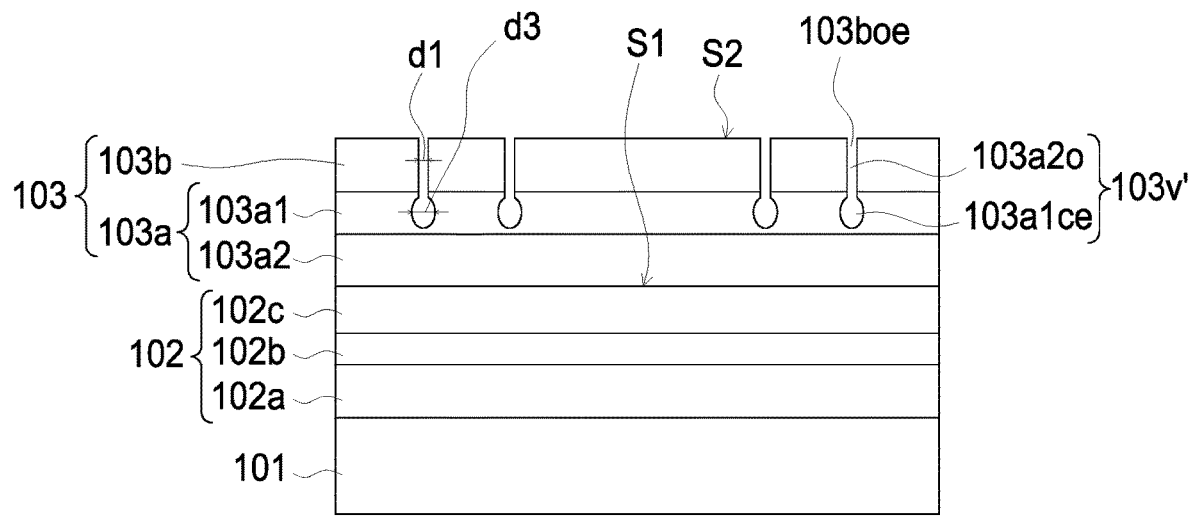
FIG. 2 shows a light-emitting device and manufacturing method thereof in accordance with a second embodiment of the present disclosure.

FIG. 2 shows a light-emitting device and manufacturing method thereof in accordance with a second embodiment of the present disclosure. As mentioned above in FIG. 1(d), the cross-sectional shape of the void may be adjusted by controlling the aluminum content along the direction which the semiconductor layer 103 is formed. In the present embodiment, the semiconductor layer 103 is different from that of the first embodiment. The first aluminum-contained layer 103a1 and the second aluminum-contained layer 103a2 of the first embodiment are exchanged in the present embodiment. That is, the second aluminum-contained layer 103a2 is formed firstly, and then the first aluminum-contained layer 103a1 is formed. As illustrated in the first embodiment, the first aluminum-contained layer 103a1 comprises aluminum arsenide (AlAs), and the second aluminum-contained layer 103a2 comprises aluminum gallium arsenide ($Al_yGa_{1-y}As$, wherein $0.5 \leq y < 1$). Because the first aluminum-contained layer 103a1 which has higher aluminum content is disposed below the second semiconductor layer 103b in the present embodiment, the etching time of the etching process for the acid solution to react can be set shorter than that in the first embodiment to etch only the first aluminum-contained layer 103a1 to form the bottom hole 103a1ce which functions as a bottom part of the void 103v'. The void 103v' comprises a bottom part near the first surface S1, such as the bottom hole 103a1ce, and an opening located on the second surface S2, such as the opening 103boe, wherein the bottom part of the void 103v' has a dimension (d3) larger than the dimension (d1) of the opening. The subsequent steps to form the light-emitting device are substantially the same as those illustrated in the first embodiment, so they are not illustrated again. Compared with the first embodiment wherein the first aluminum-contained layer 103a1 which has the higher aluminum content connects to the light-emitting stack 102, in the present embodiment, because the second aluminum-contained layer 103a2 which has the lower aluminum content connects to the light emitting stack 102, a forward voltage (Vf) can be lower than that of the first embodiment.

Figure 3:
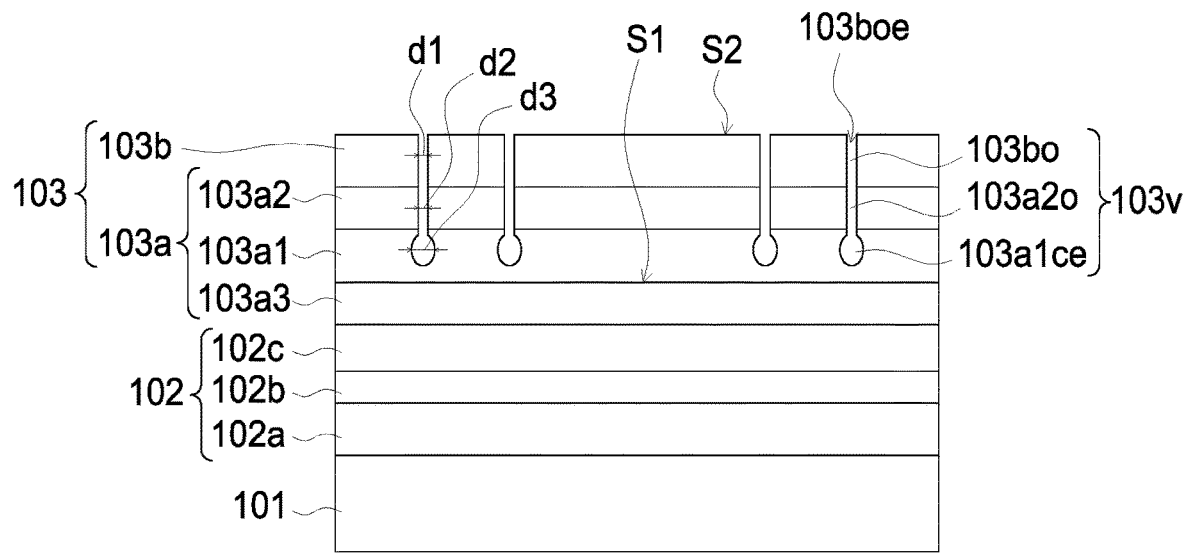
FIG. 3 shows a light-emitting device and manufacturing method thereof in accordance with a third embodiment of the present disclosure.

FIG. 3 shows a light-emitting device and manufacturing method thereof in accordance with a third embodiment of the present disclosure. In the present embodiment, a third aluminum-contained layer 103a3 is added to the semiconductor layer 103 as disclosed in the first embodiment. That is, the third aluminum-contained layer 103a3 is formed firstly, and then the first aluminum-contained layer 103a1 and the second aluminum-contained layer 103a2 of the first semiconductor layer 103a are formed subsequently, and then the second semiconductor layer 103b is formed. In the present embodiment, the third aluminum-contained layer 103a3 and the second aluminum-contained layer 103a2 are the same, and both comprise aluminum gallium arsenide ($Al_yGa_{1-y}As$, wherein $0.5 \leq y < 1$), with a thickness of about 1.5 μm. The subsequent steps to form the light-emitting device are substantially the same as those illustrated in the first embodiment, so they are not illustrated again. Compared with the first embodiment, in the present embodiment, because the third aluminum-contained layer 103a3 which has lower aluminum content connects to the light-emitting stack 102, a forward voltage (Vf) can be lower than that of the first embodiment. In addition, regarding the cross-sectional shape of the voids, compared to the second embodiment, the void 103v in the present embodiment is similar to the void 103v in the first embodiment to comprise a penetrating part 103a2o which functions as a middle part of the void 103v, and therefore the probability for light to be reflected is increased. In other words, the present embodiment comprises the advantages of the two embodiments described above.

The above-mentioned embodiments are only examples to illustrate the theory of the present invention and its effect, rather than be used to limit the present application. Other alternatives and modifications may be made by a person of ordinary skill in the art of the present application without departing from the spirit and scope of the application, and are within the scope of the present application.

What is claimed is:

1. A light-emitting device, comprising:
a substrate;
a light-emitting stack bonded to the substrate and having a light-emitting layer with a first width;
an electrode on the light-emitting stack;
a layer between the substrate and the light-emitting stack and having a second width larger than the first width;
a passivation layer on the light-emitting stack and having a first roughened surface; and
a plurality of voids formed in the layer;
wherein in a cross-sectional view, the electrode and the plurality of voids are not overlapped in a vertical direction, each of the plurality of voids is sealed in the layer and one of the plurality of voids has a third width and a fourth width different from the third width, wherein the light-emitting stack further comprises a first semiconductor layer between the light-emitting layer and the passivation layer, wherein the first semiconductor layer has a second roughened surface.

2. The light-emitting device of claim 1, further comprising a reflector between the layer and the substrate.

3. The light-emitting device of claim 2, wherein the reflector comprises gold (Au), silver (Ag) or aluminum (Al).

4. The light-emitting device of claim 1, wherein the light-emitting stack has a side wall covered by the passivation layer.

5. The light-emitting device of claim 1, wherein the electrode has a portion covered by the passivation layer.

6. The light-emitting device of claim 5, wherein the electrode has an upper surface and a side surface, and the passivation layer covers the upper surface and the side surface.

7. The light-emitting device of claim 1, wherein the electrode has an upper surface above the first roughened surface in the cross-sectional view.

8. The light-emitting device of claim 1, wherein the light-emitting stack further comprises a second semiconductor layer between the light-emitting layer and the layer, wherein the second semiconductor layer and the first semiconductor layer are of different conductivity types.

9. The light-emitting device of claim 1, wherein the light-emitting layer comprises a III-V group material.

10. The light-emitting device of claim 1, wherein the layer has a side wall covered by the passivation layer.

11. A light-emitting device, comprising:
a substrate;
a light-emitting stack bonded to the substrate and having a light-emitting layer with a first width;

an electrode on the light-emitting stack;
a semiconductor layer between the substrate and the light-emitting stack and having three layers, wherein a bottom layer has a second width larger than the first width;
a void formed in the semiconductor layer and extending in the three layers; and
an aluminum-contained layer between the semiconductor layer and the light-emitting stack;
wherein in a cross-sectional view, the electrode and the void are not overlapped in a vertical direction.

12. The light-emitting device of claim 11, wherein the aluminum-contained layer is devoid of any void.

13. The light-emitting device of claim 11, wherein the void is sealed in the semiconductor layer.

14. The light-emitting device of claim 11, further comprising a passivation layer on the light-emitting stack.

15. The light-emitting device of claim 14, wherein the semiconductor layer has a side wall not covered by the passivation layer.

16. A light-emitting device, comprising:
a substrate;
a light-emitting stack bonded to the substrate and having a light-emitting layer with a first width;
an electrode on the light-emitting stack;
a semiconductor layer between the substrate and the light-emitting stack and having a second width larger than the first width;
a conductive layer between the semiconductor layer and the substrate with the second width;
an aluminum-contained layer with the first width between the semiconductor layer and the light-emitting stack;
a void extending in the semiconductor layer; and
an opening of the void formed at an interface between the semiconductor layer and the conductive layer;
wherein in a cross-sectional view, the electrode and the void are not overlapped in a vertical direction.

17. The light-emitting device of claim 16, wherein in the cross-sectional view, the void is sealed in the light-emitting device.

18. The light-emitting device of claim 16, wherein the void has a third width and a fourth width different from the third width.

* * * * *